United States Patent
Galatenko et al.

(10) Patent No.: US 7,398,486 B2
(45) Date of Patent: Jul. 8, 2008

(54) METHOD AND APPARATUS FOR PERFORMING LOGICAL TRANSFORMATIONS FOR GLOBAL ROUTING

(75) Inventors: Alexei V. Galatenko, Moscow (RU); Elyar E. Gasanov, Moscow (RU); Andrej A. Zolotykh, Moskovskaya Oblast (RU)

(73) Assignee: LSI Corporation, Milpitas, CA (US)

( * ) Notice: Subject to any disclaimer, the term of this patent is extended or adjusted under 35 U.S.C. 154(b) by 833 days.

(21) Appl. No.: 10/803,516

(22) Filed: Mar. 17, 2004

(65) Prior Publication Data

US 2005/0210422 A1    Sep. 22, 2005

(51) Int. Cl.
G06F 17/50    (2006.01)
(52) U.S. Cl. ............................................. 716/3; 716/13
(58) Field of Classification Search ............... 716/1, 716/2, 3, 12–15
See application file for complete search history.

(56) References Cited

U.S. PATENT DOCUMENTS 7,152,031 B1 * 12/2006 Jensen et al. ................... 704/10

OTHER PUBLICATIONS

Maciej M. Syslo, "On the Fundamental Cycle Set Graph," IEEE, Mar. 1982, pp. 136-138.*
David S. Johnson, "The NP-Completeness: An Ongoing Guide," Published in J. ALGORHTMS 2, 393-405 (1981), pp. 1-12.*
Gunter Rote, "Binary trees having a given number of nodes with 0, 1 and 2 children," Institute fur Mathematik, Technische University Graz, Austria, http://www.tu-graz.ac.at/rote, Aug. 1997, pp. 1-6.*
David Nassimi, "A Parallel MSF Algorithm for Planar Graphs on a Mesh and Applications to Image Processing," IEEE, 1993, pp. 205-211.*
Chen et al., "Meet and Merge: Approximation Algorithms for Confluent Flows," ACM, Jun. 9-11, 2003, pp. 373-382.*
Goodman et al., "Advances on teh Hamiltonian Completion Problem," Journal of the Association for Computing Machinery, vol. 22, No. 3, Jul. 1975, pp. 352-360.*
Andrew Vince, "Separation Index of a Graph," 2002 wiley periodicals, Inc., 2002, pp. 53-61.*
Keselman et al., "Maximum Agreement Subtree in a Set of Evolutionary Trees—Metrics and Efficient Algorithms," IEEE, 1994, pp. 758-769.*

* cited by examiner

*Primary Examiner*—Vuthe Siek
(74) *Attorney, Agent, or Firm*—Suiter Swantz PC LLO

(57) ABSTRACT

The present invention provides a new approach and algorithm to optimize various design parameters in global routing. According to an exemplary aspect of the present invention, marked trees are first preprocessed. For every vertex incident to leaves, one may go through the list of its leaves, and if two leaves have the same mark one may leave only one of them. After that whether homeomorphism exists may be determined. The reason behind selecting such homeomorphic pairs is as follows: adding or removing a vertex of degree 2 as well as adding or removing a new leaf (variable) does not significantly modify routing (in this case all routing transformations are in essence splitting and merging routing trees). After the selection of applicable transformations, one may apply them to optimize design parameters. This may be achieved by assigning the same coordinates to nodes of degree !=2 of homeomorphic trees, which means that one may assign the coordinates of corresponding nodes to "essential" nodes and then insert or remove nodes of degree 2.

8 Claims, 5 Drawing Sheets

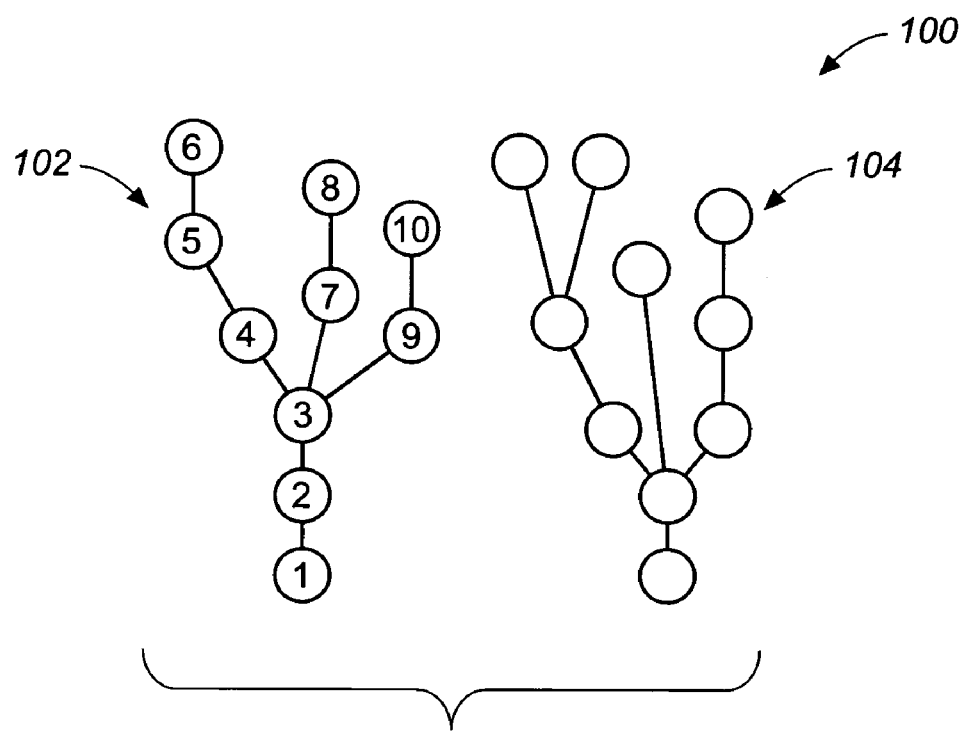
FIG._1
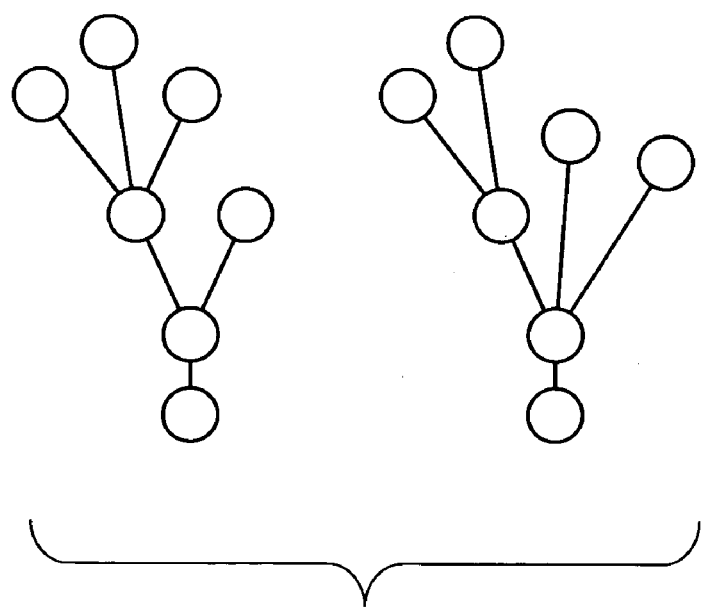
FIG._2

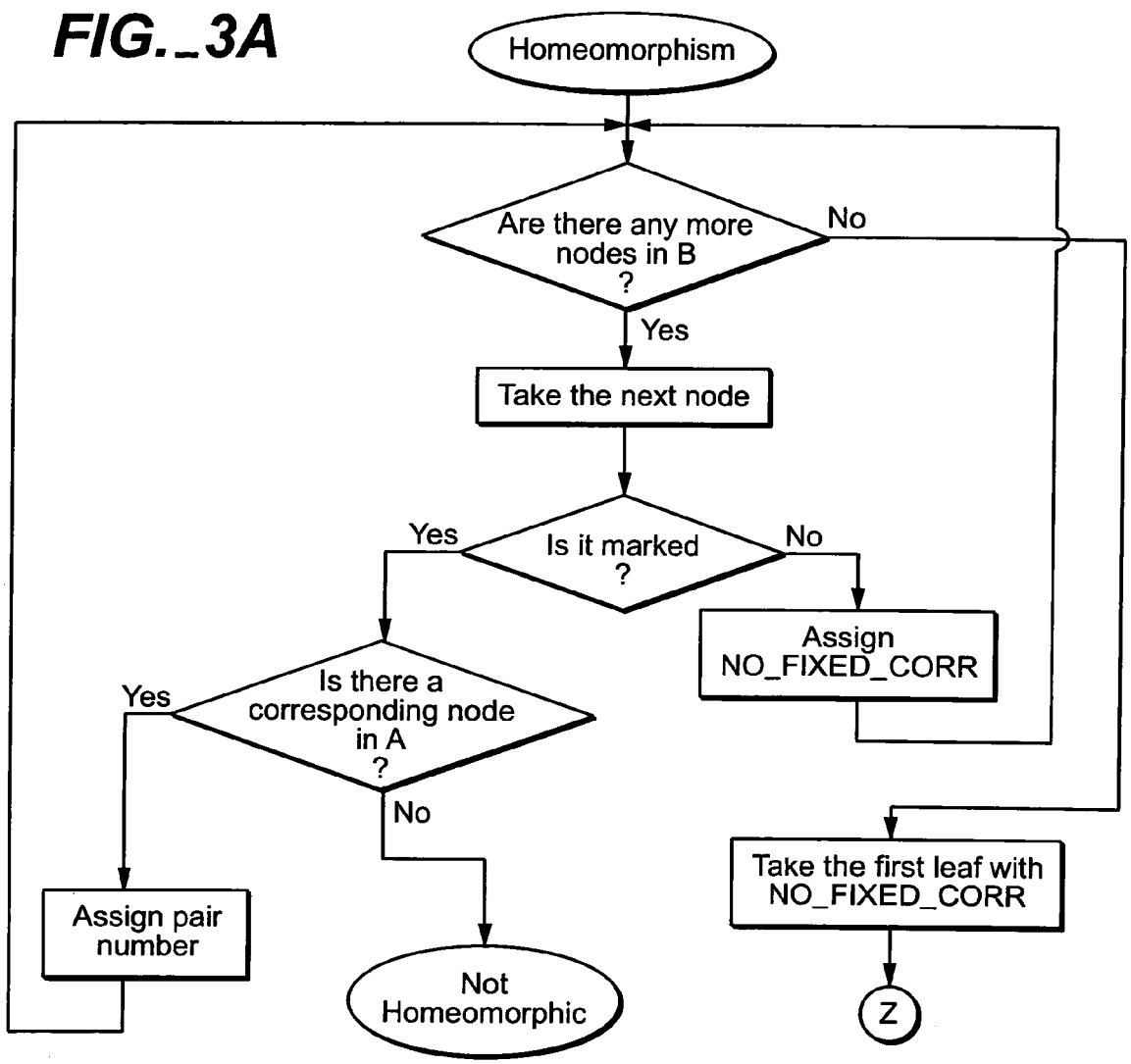
FIG._3A

FIG._3B
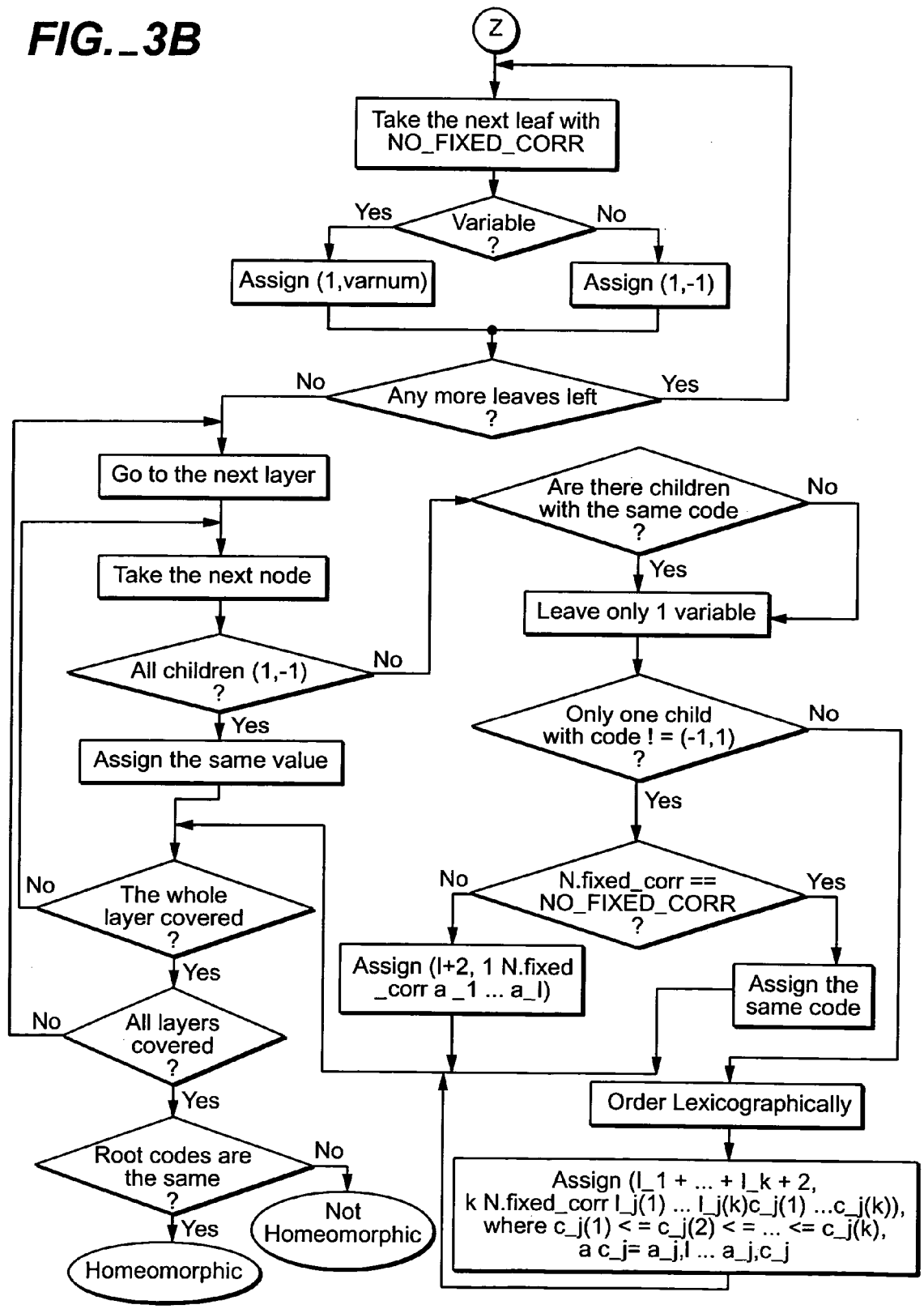

FIG._4
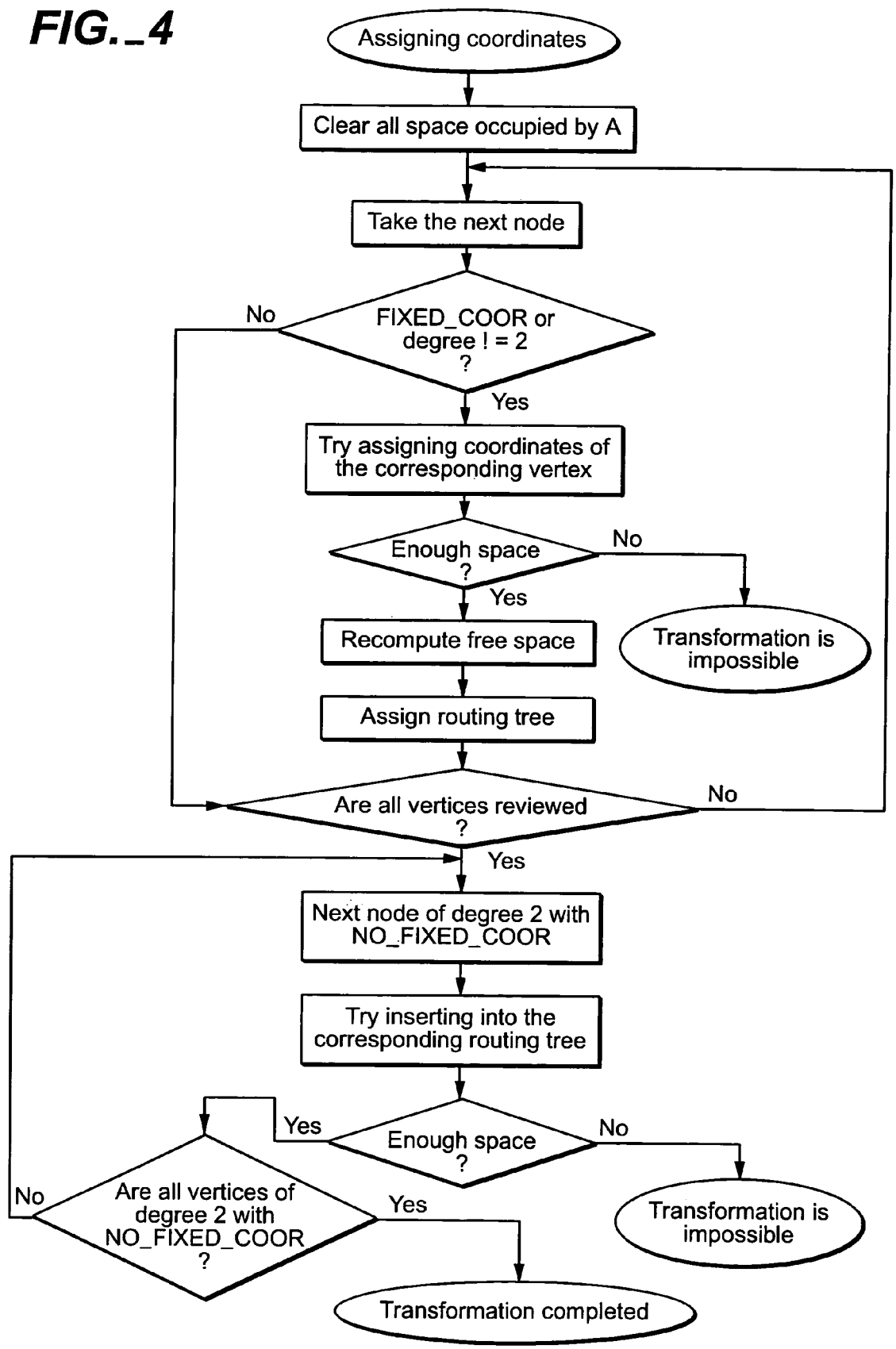

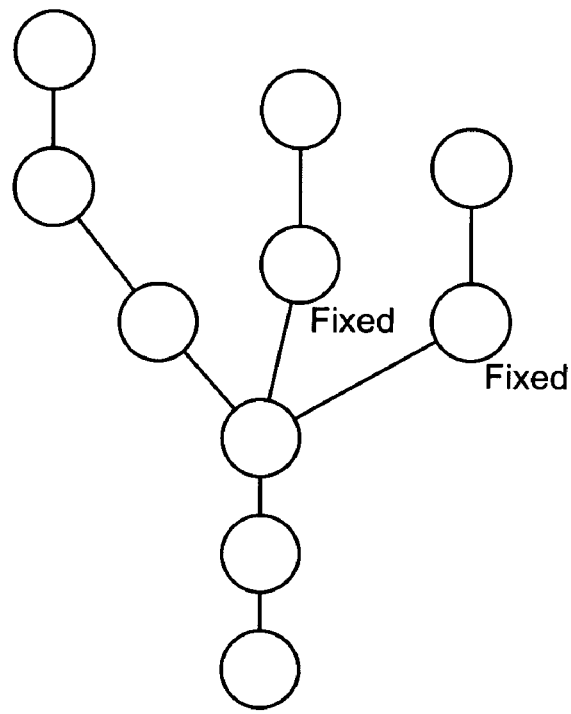
FIG._5
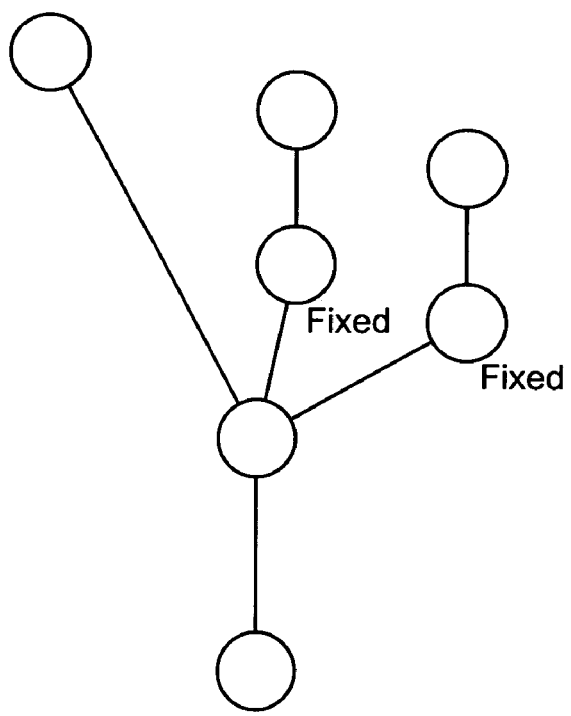
FIG._6

METHOD AND APPARATUS FOR PERFORMING LOGICAL TRANSFORMATIONS FOR GLOBAL ROUTING

CROSS-REFERENCE TO RELATED DOCUMENTS

The present application herein incorporates the following U.S. patents by reference in their entirety: (1) U.S. Pat. No. 6,564,361, entitled *Method and Apparatus for Timing Driven Resynthesis*, issued to A. Zolotykh et al. on May 13, 2003; and (2) U.S. Pat. No. 6,543,032, entitled *Method and Apparatus for Local Resynthesis of Logic Trees with Multiple Cost Functions*, issued to A. Zolotykh et al. on Apr. 1, 2003.

FIELD OF THE INVENTION

The present invention generally relates to the field of integrated circuits, and particularly to a method and apparatus for performing logical transformations for global routing.

BACKGROUND OF THE INVENTION

A typical integrated circuit (IC) design flow often includes a logical design and a physical design. A logic design may include the following steps: (1) design entry (to enter the design into an IC design system, either using a hardware description language or schematic entry); (2) logical synthesis (to use a hardware description language such as VHDL or Verilog or the like and a logical synthesis tool to produce a netlist, which is a description of logical cells and their connections); (3) system partitioning (to divide a large system into small pieces); and (4) pre-layout simulation (to check whether a design functions correctly). A physical design may include the following steps: (1) floorplanning (to arrange blocks of a netlist on a chip); (2) placement (to decide the location of cells in a block); (3) routing (to make connections between cells and blocks); (4) extraction (to determine resistance and capacitance of the interconnect); and (5) post-layout simulation (to check whether the design still works with the added loads of the interconnect).

Once the IC designer has floorplanned a chip and logic cells within the flexible blocks have been placed, it is time to make the connections by routing the chip. Routing is usually divided into global routing and detailed routing. In global routing, connections are completed between the proper blocks of the IC, disregarding the exact geometric details of each wire and terminal. For each wire, a global router finds a list of channels that are to be used as a passageway for that wire. In other words, global routing specifies the loose route of a wire through different regions of the routing space. Thus, a global router does not make any connections—it just plans them. Global routing is followed by detailed routing which completes point-to-point connections between terminals on the blocks. Loose routing is converted into exact routing by specifying the geometric information such as width of wires and their layer assignments. Detailed routing includes the exact channel routing of wires.

The input to a global router is a floorplan that includes the location of all fixed and flexible blocks, the placement information for flexible blocks, and the location of all logical cells. The goal of global routing is to provide complete instructions to the detailed router on where to route every net. Global routing tries to achieve at least one of the following objectives: (1) to minimize the total interconnect length; (2) to maximize the probability that detailed router can complete the routing; and (3) to minimize the critical path delay. Many methods used in global routing are based on the solution to the tree on a graph problem. Therefore, it would be desirable to provide a method and apparatus for performing logical transformations for global routing to optimizing design parameters.

SUMMARY OF THE INVENTION

Accordingly, the present invention provides a new approach and algorithm to optimize various design parameters in global routing. According to an exemplary aspect of the present invention, marked trees are first preprocessed. For every vertex incident to leaves, one may go through the list of its leaves, and if two leaves have the same mark one may leave only one of them. After that whether homeomorphism exists may be determined. The reason behind selecting such homeomorphic pairs is as follows: adding or removing a vertex of degree 2 as well as adding or removing a new leaf (variable) does not significantly modify routing (in this case all routing transformations are in essence splitting and merging routing trees). After the selection of applicable transformations, one may apply them to optimize design parameters. This may be achieved by assigning the same coordinates to nodes of degree !=2 of homeomorphic trees, which means that one may assign the coordinates of corresponding nodes to "essential" nodes and then insert or remove nodes of degree 2.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 illustrates homeomorphic trees in accordance with an exemplary embodiment of the present invention;

FIG. 2 illustrates trees that are not homeomorphic in accordance with an exemplary embodiment of the present invention;

FIGS. 3A and 3B depict a flowchart showing a method for determining homeomorphism between two logical trees A and B in accordance with an exemplary embodiment of the present invention;

FIG. 4 is a flowchart showing a method for assigning coordinates to nodes of homeomorphic trees A and B in accordance with an exemplary embodiment of the present invention;

FIG. 5 shows an original path to assign coordinates in accordance with an exemplary embodiment of the present invention; and FIG. 6 shows placing essential nodes in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

The present invention provides a new approach and algorithm to optimize various design parameters in global routing.

The algorithm may be used to generate a list of transformation families which may be utilized in the process of design resynthesis without significant routing modifications. The concrete transformations may then be utilized to improve design parameters.

A. Introduction

A transformation family is a pair of marked logical trees. A pair of trees is called suitable if and only if the trees are homeomorphic. Two trees T_1 and T_2 are homeomorphic if and only if T'_1 and T'_2 are isomorphic, where T'_1 and T'_2 are obtained from T_1 and T_2 by removing all vertices of degree 2, respectively. Two trees are isomorphic if and only if there exists a one-to-one correspondence between their vertices and edges while preserving the incidence relationship.

A tree is a graph in which any two vertices are connected by exactly one path. A path is a sequence of vertices such that from each of its vertices there is an edge to the successor vertex. An edge connects two vertices; these two vertices are said to be incident to the edge. The degree of a vertex is the number of edges incident to the vertex. A vertex is also called a node. A child node is a node that is linked to by a parent node. A leaf node (or leaf) is a node with no child nodes.

FIG. 1 illustrates homeomorphic trees 100 in accordance with an exemplary embodiment of the present invention. As shown, the tree 102 has a vertex set V={1, 2, 3, 4, 5, 6, 7, 8, 9, 10}and an edge set E={{1,2}, {2,3}, {3,4}, {3,7}, {3,9}, {4,5}, {5,6}, {7,8}, {9,10}}. The unique simple path connecting the vertices 6 and 10 is 6-5-4-3-9-10. The vertices 1, 6, 8, and 10 have a degree of 1, the vertices 2, 4, 5, 7, and 9 have a degree of 2, and the vertex 3 has a degree of 4. Those of ordinary skill in the art will understand that the trees 102 and 104 are homeomorphic. FIG. 2 illustrates trees that are not homeomorphic in accordance with an exemplary embodiment of the present invention.

According to one aspect of the present invention, marked trees are first preprocessed. For every vertex incident to leaves, one may go through the list of its leaves, and if two leaves have the same mark one may leave only one of them. After that one may look for homeomorphism. The reason behind selecting such homeomorphic pairs is as follows: adding or removing a vertex of degree 2 as well as adding or removing a new leaf (variable) does not significantly modify routing (in this case all routing transformations are in essence splitting and merging routing trees).

After the selection of applicable transformations, one may apply them to optimize design parameters. This may be achieved by assigning the same coordinates to nodes of degree !=2 of homeomorphic trees, which means that one may assign the coordinates of corresponding nodes to "essential" nodes and then insert or remove nodes of degree 2.

Let A and B be two logical trees. Some nodes of these trees may be marked. If a node is marked, it means that a sub-tree with a root node in this node may not change when B is obtained from A. One may call a marked node of A corresponding to a marked node of B, if these nodes have the same coordinates and the same type.

B. Determining Homeomorphism

FIGS. 3A and 3B depict a flowchart showing a method for determining homeomorphism between two logical trees A and B in accordance with an exemplary embodiment of the present invention. As shown, the method may include the following steps.

1) Step A

Pairs (Na, Nb) may be found, where Na is a marked node of A, Nb is a marked node of B, and Na is a corresponding node of Nb. For the n-th pair (Na, Nb), one may assign a value n to the parameter fixed_corr of Na and Nb. For all nodes that are not in pairs of corresponding nodes, one may assign NO_FIXED_CORR value to fixed_corr. If there are marked nodes in B for which no corresponding nodes in A exist, an error code may be returned.

2) Step B

A code (a pair (I, a_1 a_2 ... a_I), where I is the length and a_1 ... a_I is an array of integers) may be assigned to each node of A and B. The following procedure may be used to assign a code to a node N:

i) If N is a variable, the code is (1, variable number);
ii) If N is a constant, the code is (1, −1); and
iii) Suppose that N has children and codes of children are determined as follows:
   a) If all children have the code (1, −1), the same code (1, −1) is assigned to N; and
   b) (1) If there are several children that are variables with the same variable number, one may leave only one of these children;
      (2) If only one significant (i.e., with a code different from (1,−1)) child is left after (1), and this child has a code (I, a_1 ... a_I), one may assign the same code to N if N.fixed_corr=NO_FIXED_CORR; otherwise, one may assign code (I+2, 1 N.fixed_corr a_1 ... a-I) to N; and
      (3) If several significant children are left after (1), and codes of these children are (I_1, c_1) ... (I_k, c_k) (k>=2) (c_j=a_j,1 ... a_j,c_j), one may order these codes lexicographically (c_j(1)<=c_j(2)<= ... <=c_j(k)) and assign code (I_1+ ... +I_k+2, k N.fixed_corr I_j(1) ... I_j(k) c_j(1) ... c_j(k)) to N.

3) Step C

If root nodes have the same code, homeomorphism exists. Otherwise, homeomorphism cannot be established.

C. Assigning Coordinates

FIG. 4 is a flowchart showing a method for assigning coordinates to nodes of homeomorphic trees A and B in accordance with an exemplary embodiment of the present invention. As shown, the method may include the following steps.

1) Step A

All space occupied by the logical tree A may be cleared.

2) Step B

One may assign corr_node fields for nodes of A and B with (number of children !=1) or (fixed_corr !=NO_FIXED_CORR) in the following way: corr_nodes should have the same code. If a node has several children that are variables with the same variable number, one may assign corr_node only for one of these variables; for others, one may put corr_node=NULL. For nodes with fixed_corr=NO_FIXED_CORR and children number=1, one may assign corr_node=NULL. If one fails to assign corr_node to some nodes, an error code is returned.

3) Step C

One may assign coordinates to nodes N of B with the number of children>=2 or with fixed_corr !=NO_FIXED_CORR (the coordinates are the coordinates of N->corr_node). One may also assign a routing tree to N.corr_node (one may merge the routing tree of N.corr_node with routing trees of father, grandfather, ... of N.corr_node while these grandfathers have only one child). One may change free space to show that the node is added to the field.

4) Step D

One may slightly change correspondence (corr_nodes) for variables to achieve the following: routing positions of corresponding variables should coincide. For variables with NULL corr_node in B, one may put routing position=−1.

5) Step E

One may assign variable trees as follows: for each variable, one may merge the tree of these variables with routing trees of all nodes from A that have the only child—this variable.

6) Step F

If a node of A has several children that are variables with the same variable number, one may delete parts of this variable's routing tree that corresponds to these children except one (the one that does not have NULL corr_node, see the foregoing Step D) (see, e.g., FIGS. 5 and 6).

7) Step G

One may insert nodes N of B with the number of children=1. This may be accomplished by trying to insert this node to every segment between the first grandfather and the first grandson that have 0 or >=2 children, and determine if this is possible (i.e. if there is place left). If successful, one may split the routing tree of grandchild, assign the routing tree to N (the second part of split tree), and change free space; if one fails to insert a node, an error code is returned and one may go to Step J.

8) Step H

One may assign routing positions to variables that have routing position=−1. This may be accomplished by adding the imaginary segment to the variable routing tree.

9) Step I

One may re-compute delays and caps.

10) Step J

One may clear the space occupied by B (by nodes that one has managed to put), put back nodes of A, and return the result: an error code or a success code. If the result is a success code, all nodes of B have correct coordinates and routing trees assigned.

It is to be noted that the above described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of software package. Such a software package may be a computer program product which employs a storage medium including stored computer code which is used to program a computer to perform the disclosed function and process of the present invention. The storage medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for performing logical transformations for global routing in an integrated circuit design, comprising steps of:
(a) determining whether homeomorphism exists between logic trees A and B, wherein said determining comprises:
assigning a value n to a parameter fixed_corr of Na and Nb for a n-th pair (Na, Nb), where Na is a marked node of said logic tree A, Nb is a marked node of said logic tree B, and Na is a corresponding node of Nb; assigning NO_FIXED_CORR value to fixed_corr for all nodes of said logical trees A and B that are not in pairs of corresponding nodes; and returning an error code when there are marked nodes in said logical tree B for which no corresponding nodes in said logical tree A exist;
assigning a code (a pair (I, a__1 a__2 ... a_I) to a node N of said logic trees A and B, where I is a length and a__1 ... a_I is an array of integers;
i) when N is a variable, said code is (1, variable number);
ii) when N is a constant, said code is (1, −1); and
iii) when N has children and codes of children are determined as follows:
a) when all children have the code (1, −1), the same code (1, −1) is assigned to N; and
b) (1) when there are several children that are variables with the same variable number, one may leave only one of these children;
(2) when only one significant (i.e., with a code different from (1, −1)) child is left after said (1), and this child has a code (I, a__1 ... a_I), the same code is assigned to N if N.fixed_corr=NO_FIXED_CORR; otherwise, code (I+2, 1 N.fixed_corr a 1 ... a-I) is assigned to N; and
(3) when several significant children are left after said (1), and codes of these children are (I__1, c__1) ... (I_k, c_k) (k >=2) (c_j=a_j,1 ... a_j,c_j), these codes are ordered lexicographically (c_j(1) <=c_j (2) <= ... <= c_j(k)) and code(I__1 ... +I_k2, k N.fixed_corr I_j(1) ... I_j(k) c_j(1) ... c_j(k)) is assigned to N; and
establishing homeomorphism between said logic trees A and B when root nodes of said logical tress A and B have the same code;
(b) when homeomorphism exists between said logic trees A and B, assigning same coordinates to nodes of degree !=2 of said logic trees A and B, wherein said assigning same coordinates comprises:
(b1) clearing all space occupied by said logical tree A;
(b2) assigning corr_node fields for nodes of said logical trees A and B with (number of children !=1) or (fixed_corr !=NO_FIXED_CORR) in the following way: corr_nodes should have the same code; assigning corr_node only for one of these variables when a node has several children that are variables with the same variable number; assign corr_node=NULL for nodes with fixed_corr=NO_FIXED_CORR and children number=1; and returning an error code when one fails to assign corr_node to some nodes;

(b3) assigning coordinates to nodes N of said logic tree B with the number of children>=2 or with fixed_corr !=NO_FIXED_CORR; assigning a routing tree to N.corr_node; and changing free space to show that a node is added to a field;

(b4) slightly changing correspondence (corr_nodes) for variables to achieve the following: routing positions of corresponding variables should coincide; and for variables with NULL corr_node in said logic tree B, putting routing position=-1;

(b5) assigning variable trees as follows: for each variable, merging a tree of these variables with routing trees of all nodes from said logic tree A that have the only child;

(b6) when a node of said logic tree A has several children that are variables with the same variable number, deleting parts of this variable's routing tree that corresponds to these children except one that does not have NULL corr_node;

(b7) inserting nodes N of said logic tree B with the number of children=1;

(b8) assigning routing positions to variables that have routing position=-1;

(b9) re-computing delays and caps; and (b10) clearing a space occupied by said logical tree B, putting back nodes of said logical tree A, and returning a result: an error code or a success code, wherein when the result is a success code, all nodes of B have correct coordinates and routing trees assigned.

2. An apparatus for performing logical transformations for global routing in an integrated circuit design, comprising:

(a) means for determining whether homeomorphism exists between logic trees A and B, said determining means comprises:

means for assigning a value n to a parameter fixed_corr of Na and Nb for a n-th pair (Na, Nb), where Na is a marked node of said logic tree A, Nb is a marked node of said logic tree B, and Na is a corresponding node of Nb; means for assigning NO_FIXED_CORR value to fixed_corr for all nodes of said logical trees A and B that are not in pairs of corresponding nodes; and means for returning an error code when there are marked nodes in said logical tree B for which no corresponding nodes in said logical tree A exist; and means for establishing homeomorphism between said logic trees A and B when root nodes of said logical tress A and B have the same code; and (b) when homeomorphism exists between said logic trees A and B, means for assigning same coordinates to nodes of degree !=2 of said logic trees A and B; said assigning means comprising:

(b1) means for clearing all space occupied by said logical tree A;

(b2) means for assigning corr node fields for nodes of said logical trees A and B with (number of children !=1) or (fixed_corr !=NO_FIXED_CORR) in the following way: corr_nodes should have the same code; means for assigning corr_node only for one of these variables when a node has several children that are variables with the same variable number; means for assign corr_node=NULL for nodes with fixed_corr=NO_FIXED_CORR and children number=1; and means for returning an error code when one fails to assign corr_node to some nodes;

(b3) means for assigning coordinates to nodes N of said logic tree B with the number of children>=2 or with fixed_corr !=NO_FIXED_CORR: means for assigning a routing tree to N.corr_node; and means for changing free space to show that a node is added to a field.

3. The apparatus of claim 2, wherein said means (a) further comprises:

(a2) means for assigning a code (a pair (I, a_1 a_2 ... a_I) to a node N of said logic trees A and B, where I is a length and a_ ... a_I is an array of integers.

4. The apparatus of claim 3, wherein in said means (a2):

i) when N is a variable, said code is (1, variable number);

ii) when N is a constant, said code is (1, -1); and iii) when N has children and codes of children are determined as follows:

a) when all children have the code (1, -1), the same code (1, -1) is assigned to N; and b) (1) when there are several children that are variables with the same variable number, one may leave only one of these children;

(2) when only one significant (i.e., with a code different from (1, -1)) child is left after said (1), and this child has a code (I, a_1 ... a_I), the same code is assigned to N if N.fixed_corr=NO_FIXED_CORR; otherwise, code (I+2, 1 N.fixed_corr a_1 ... a-I) is assigned to N; and (3) when several significant children are left after said (1), and codes of these children are (I_1, c_1) ... (I_k, c_k) (k >=2) (c_j=a_j,1 ... a_j,c_j), these codes are ordered lexicographically (c_j(1) <=c_j (2) <= ... <=c_j(k)) and ode (I_1 + ... +I_k +2, k N.fixed_corr I_j(1) ... I_j(k) c_j(1) ... c_j(k)) is assigned to N.

5. The apparatus of claim 2, wherein said means (b) comprises:

(b4) means for slightly changing correspondence (corr_nodes) for variables to achieve the following: routing positions of corresponding variables should coincide; and for variables with NULL corr_node in said logic tree B, means for putting routing position=-1;

(b5) means for assigning variable trees as follows: for each variable, merging a tree of these variables with routing trees of all nodes from said logic tree A that have the only child;

(b6) when a node of said logic tree A has several children that are variables with the same variable number, means for deleting parts of this variable's routing tree that corresponds to these children except one that does not have NULL corr_node;

(b7) means for inserting nodes N of said logic tree B with the number of children=1;

(b8) means for assigning routing positions to variables that have routing position=-1;

(b9) means for re-computing delays and caps; and (b10) means for clearing a space occupied by said logical tree B, means for putting back nodes of said logical tree A, and means for returning a result: an error code or a success code, wherein when the result is a success code, all nodes of B have correct coordinates and routing trees assigned.

6. A computer-readable medium having computer-executable instructions for performing a method for performing logical transformations for global routing in an integrated circuit design, said method comprising steps of:

(a) determining whether homeomorphism exists between logic trees A and B, said determining comprising:

assigning a value n to a parameter fixed_corr of Na and Nb for a n-th pair (Na, Nb), where Na is a marked node of said logic tree A, Nb is a marked node of said logic tree B, and Na is a corresponding node of Nb; assigning NO_FIXED_CORR value to fixed corr for all nodes of said logical trees A and B that are not in pairs of corresponding nodes; and returning an error code when there are marked nodes in said logical tree B for which no corresponding nodes in said logical tree A exist; and establishing homeomorphism between said logic trees A and B when root nodes of said logical tress A and B have the same code; and (b) when homeomorphism exists between said logic trees A and B, assigning same coordinates to nodes of degree !=2 of said logic trees A and B, said assigning same coordinates, comprising:

(b1) clearing all space occupied by said logical tree A;

(b2) assigning corr node fields for nodes of said logical trees A and B with (number of children !=1) or (fixed_corr !=NO_FIXED_CORR) in the following way: corr_nodes should have the same code; assigning corr_node only for one of these variables when a node has several children that are variables with the same variable number; assign corr_node=NULL for nodes with fixed_corr=NO_FIXED_CORR and children number=1; and returning an error code when one fails to assign corr_node to some nodes;

(b3) assigning coordinates to nodes N of said logic tree B with the number of children>=2 or with fixed_corr !=NO_FIXED_CORR; assigning a routing tree to N.corr_node; and changing free space to show that a node is added to a field;

(b4) slightly changing correspondence (corr_nodes) for variables to achieve the following: routing positions of corresponding variables should coincide; and for variables with NULL corr_node in said logic tree B, putting routing position=−1;

(b5) assigning variable trees as follows: for each variable, merging a tree of these variables with routing trees of all nodes from said logic tree A that have the only child;

(b6) when a node of said logic tree A has several children that are variables with the same variable number, deleting parts of this variable's routing tree that corresponds to these children except one that does not have NULL corr_node;

(b7) inserting nodes N of said logic tree B with the number of children=1;

(b8) assigning routing positions to variables that have routing position=−1;

(b9) re-computing delays and caps; and (b10) clearing a space occupied by said logical tree B, putting back nodes of said logical tree A, and means for returning a result; an error code or a success code, wherein when the result is a success code, all nodes of B have correct coordinates and routing trees assigned.

7. The computer-readable medium of claim 6, wherein said step (a) further comprises:

(a2) assigning a code (a pair (I, a_1 a_2 ... a_I) to a node N of said logic trees A and B, where I is a length and a_1 ... a_I is an array of integers.

8. The computer-readable medium of claim 7, wherein in said step (a2):

i) when N is a variable, said code is (1, variable number);

ii) when N is a constant, said code is (1, −1); and iii) when N has children and codes of children are determined as follows:

a) when all children have the code (1, −1), the same code (1, −1) is assigned to N; and b) (1) when there are several children that are variables with the same variable number, one may leave only one of these children;

(2) when only one significant (i.e., with a code different from (1, −1)) child is left after said (1), and this child has a code (I, a_1 ... a_I), the same code is assigned to N if N.fixed_corr=NO_FIXED_CORR; otherwise, code (I+2, 1 N.fixed_corr a_1 ... a-I) is assigned to N; and (3) when several significant children are left after said (1), and codes of these children are (I_1, c_1) ... (I_k, c_k) (k>=2) (c_j=a_j,1 ... a_j, c_j), these codes are ordered lexicographically (c_j(1)<=c_j(2)<= ... <=c_j(k)) and code (I_1 + ... + I_k+2, k N.fixed corr I_j(1) ... I_j(k) c_j(1) ... c_j(k)) is assigned to N.

* * * * *